United States Patent
Lin

(10) Patent No.: US 8,472,261 B2
(45) Date of Patent: Jun. 25, 2013

(54) READING DEVICES FOR MEMORY ARRAYS

(75) Inventor: Hung-Hsueh Lin, Hsinchu County (TW)

(73) Assignee: Winbond Electronics Corp., Taichung (TW)

( * ) Notice: Subject to any disclaimer, the term of this patent is extended or adjusted under 35 U.S.C. 154(b) by 133 days.

(21) Appl. No.: 13/274,779

(22) Filed: Oct. 17, 2011

(65) Prior Publication Data

US 2013/0094300 A1 Apr. 18, 2013

(51) Int. Cl.
*G11C 7/10* (2006.01)

(52) U.S. Cl.
USPC ............ 365/189.02; 365/189.14; 365/189.15; 365/189.17; 365/200; 365/230.02

(58) Field of Classification Search
USPC ............ 365/189.02, 189.15, 230.02, 189.14, 365/189.04, 200, 189.11, 189.17, 205, 207
See application file for complete search history.

(56) References Cited

U.S. PATENT DOCUMENTS

| 5,619,473 A | 4/1997 | Hotta | |
|---|---|---|---|
| 2004/0130926 A1* | 7/2004 | Nakase | 365/145 |
| 2004/0257874 A1* | 12/2004 | Tanaka et al. | 365/185.09 |
| 2008/0019184 A1* | 1/2008 | Mitani et al. | 365/185.21 |
| 2010/0290290 A1* | 11/2010 | Kono et al. | 365/185.21 |

* cited by examiner

*Primary Examiner* — Alexander Sofocleous
*Assistant Examiner* — Hien Nguyen
(74) *Attorney, Agent, or Firm* — Muncy, Geissler, Olds & Lowe, PLLC

(57) ABSTRACT

A reading device for a memory array is provided. The memory array comprises memory cell columns. The reading device comprises first sensing amplifier groups, a second sensing amplifier group, and an output unit. Each first sensing amplifier groups selectively generates a first sensing output signal. The second sensing amplifier group generates a second sensing output signal. The output unit selectively outputs one of the second sensing output signal and the first sensing output signals according to a page address signal. In a reading operation period, the reading device reads data from a column group to the first sensing amplifier groups. In the reading operation period, when the page address signal indicates an initial input address, initial address data read from the specific column set corresponding to the initial input address among the column group is transmitted to the second sensing amplifier group to generate the second sensing output signal.

26 Claims, 4 Drawing Sheets

READING DEVICES FOR MEMORY ARRAYS

BACKGROUND OF THE INVENTION

1. Field of the Invention

The invention relates to a memory system, and more particularly to a reading device for a memory system which has an improved data sensing structure.

2. Description of the Related Art

In a memory system, to enhance working efficiency for memory reading and writing operations, prior arts adopt specification of page reading buffering to read data from a memory to effectively raise an average reading rate. In the specification of page reading buffering, a plurality of page buffers are required for a reading operation of one page. To make all of the gate buffers capable of randomly and rapidly reading data from a memory, one set of high speed sensing amplifiers is configured, and the number of high speed sensing amplifiers in the one set is equal to the number of page buffers. However, the configuration of the high speed sensing amplifiers induces a large current and big noise and even affects the operation speed of high speed sensing amplifiers. Moreover, with the increment of the size of one page, the number of page buffers has to be increased. Accordingly, the number of high speed sensing amplifiers is also increased. The large area occupied by the large number of high speed sensing amplifiers may cause increased power consumption.

Thus, it is desired to provide a memory system and a reading device thereof which can improve the drawback of prior arts.

BRIEF SUMMARY OF THE INVENTION

An exemplary embodiment of a reading device for a memory array is provided. The memory array comprises a plurality of memory cell columns. The reading device comprises a plurality of first sensing amplifier groups, a second sensing amplifier group, and an output unit. Each of the plurality of first sensing amplifier groups selectively generates a first sensing output signal. The second sensing amplifier group generates a second sensing output signal. The output unit is coupled to the plurality of first sensing amplifier groups and the second sensing amplifier group. The output unit temporarily stores the second sensing output signal and the first sensing output signals and selectively outputs one of the second sensing output signal and the first sensing output signals according to a page address signal. In a reading operation period, the reading device reads data from a column group among the plurality of memory cell columns to the plurality of first sensing amplifier groups according to a column address signal. The column group comprises a plurality of specific column sets. In the reading operation period, when the page address signal indicates an initial input address, data read from the specific column set corresponding to the initial input address serves as initial address data. The initial address data is transmitted to the second sensing amplifier group, and the second sensing amplifier group generates the second sensing output signal according to the initial address data.

An exemplary embodiment of a memory system is provided. The memory system comprises a memory array and a reading device. The memory array comprises a plurality of memory cell columns. The reading device reads data from a column group among the plurality of memory cell columns according to a column address signal. The column group comprises a plurality of specific column sets. The reading device comprises a plurality of first sensing amplifier groups, a second sensing amplifier group, and an output unit. Each of the plurality of first sensing amplifier groups selectively generates a first sensing output signal. The second sensing amplifier group generates a second sensing output signal. The output unit is coupled to the plurality of first sensing amplifier groups and the second sensing amplifier group. The output unit temporarily stores the second sensing output signal and the first sensing output signals and selectively outputs one of the second sensing output signal and the first sensing output signals according to a page address signal. In the reading operation period, when the page address signal indicates an initial input address, data read from the specific column set corresponding to the initial input address serves as initial address data. The initial address data is transmitted to the second sensing amplifier group, and the second sensing amplifier group generates the second sensing output signal according to the initial address data.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

According to the specification of page reading buffering, at the beginning of a read operation for one page, much time is required to read first data. The following data in the same page is read rapidly, and the time of reading the following data is equal to ¼ or ⅕ of the time of reading the first data. The invention provides a structure of a reading device. According to the reading device, a high speed sensing amplifier group is used to read the first data in one page, and a plurality of low power sensing amplifier groups are used to read the following data in the same page. Accordingly, compared with prior arts, data of one page can be read rapidly, and power consumption can be decreased.

Figure 1:
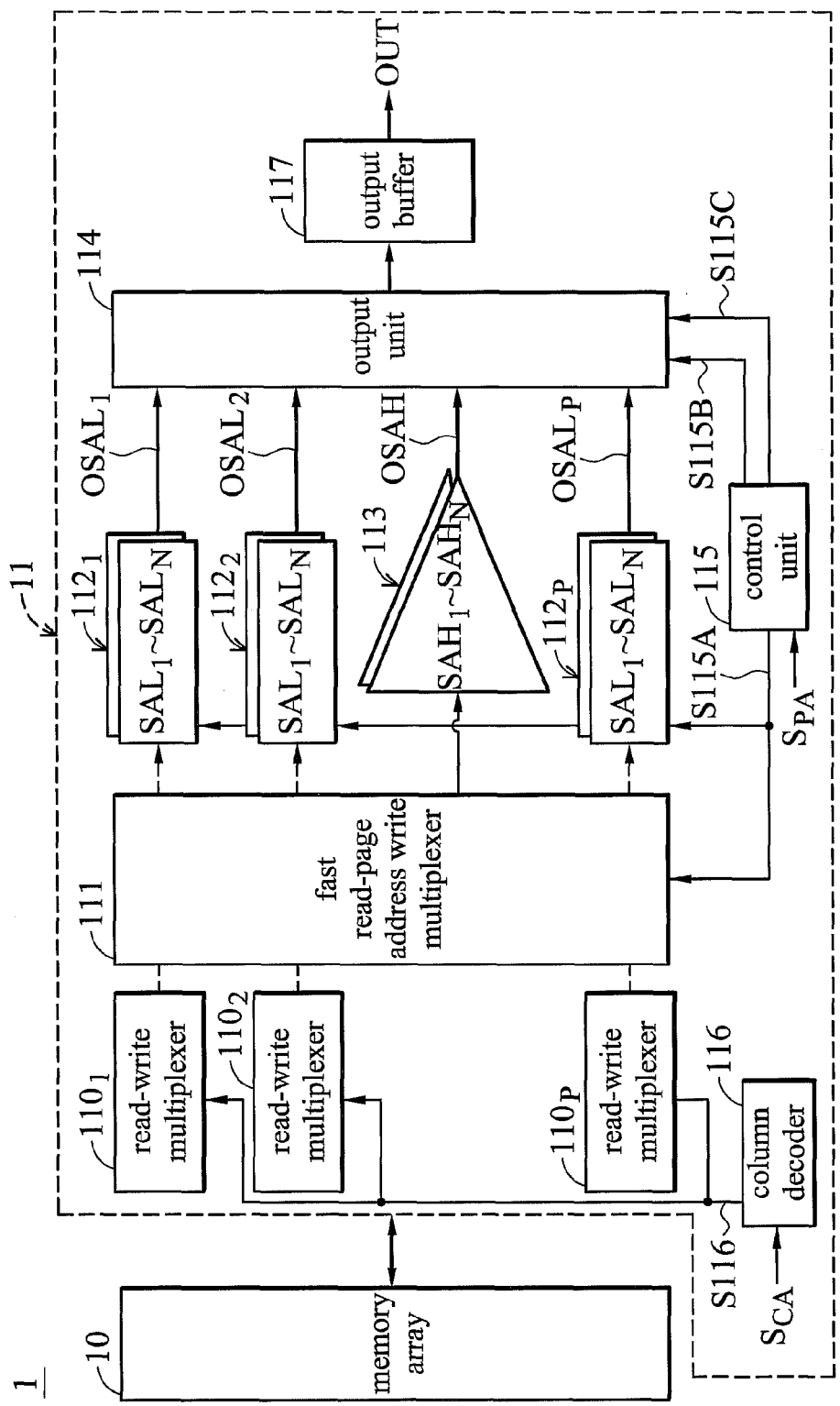
FIG. 1 shows one exemplary embodiment of a memory system.

FIG. 1 shows one exemplary embodiment of a memory system. As shown in FIG. 1, a memory system 1 comprises a memory array 10 and a reading device 11. The memory array 10 comprises a plurality of memory cell columns. In a reading operation period for one page, the reading device 11 reads data of one page from a column group among the plurality of memory cell columns according to a column address signal $S_{CA}$. The column group is divided into P specific column sets (P is a positive integer) to read the data of the one page by P times, and N bits are read each time (N is a positive integer). In other words, one page is divided into P data to be read, and the data read each time has N bits. In order to conform to the specification of page reading buffering, the reading device 11 comprises a plurality of read-write multiplexers $110_1$-$110_P$ and a plurality of low power sensing amplifier groups $112_1$-$112_P$. The read-write multiplexers $110_1$-$110_P$ are respectively coupled to P specific column sets in one column group of one page according to the column address signal $S_{CA}$. The low power sensing amplifier groups $112_1$-$112_P$ are coupled to the read-write multiplexers $110_1$-$110_P$ respectively. Moreover, the reading device 11 further comprises a fast read-page address write multiplexer 111, a high speed sensing amplifier group 113, an output unit 114, a control unit 115, a column decoder 116, and an output buffer 117. Each of the low power sensing amplifier groups $112_1$-$112_P$ comprises N low power sensing amplifiers $SAL_1$-$SAL_N$, and the high speed sensing amplifier group 113 comprises N high speed sensing amplifiers $SAH_1$-$SAH_N$. In the following embodiments, a reading operation period for one page is given as an example to describe the operation of the reading device 11.

Referring to FIG. 1, the column decoder 116 receives the column address signal $S_{CA}$ and decodes the column address signal $S_{CA}$ to generate a control signal S116. The column address signal $S_{CA}$ indicates which page is being read by the reading device. Thus, the read-write multiplexers $110_1$-$110_P$ are controlled by the control signal S116 derived from the column address signal $S_{CA}$ to be respectively coupled to P specific column sets in a column group of the page which is being read. For example, the read-write multiplexer $110_1$ is coupled to the specific column set which is arranged as the first one among the P specific column sets in the column group of the read page, and the read-write multiplexer $110_P$ is coupled to the specific column set which is arranged as the P-th one among the P specific column sets in the column group of the read page.

The low power sensing amplifier groups $112_1$-$112_P$ are coupled to the read-write multiplexers $110_1$-$110_P$ respectively. In the reading operation period, the read-write multiplexers $110_1$-$110_P$ transmit the P data read from the memory array 10 respectively to the low power sensing amplifier groups $112_1$-$112_P$, wherein, as described above, each of the P data has N bits. The low power sensing amplifiers $SAL_1$-$SAL_N$ in each of the low power sensing amplifier groups $112_1$-$112_P$ generate a sensing output signal with N bits according to the received N-bit data.

According to FIG. 1, the control unit 115 receives a page address signal $S_{PA}$. The page address signal $S_{PA}$ indicates P addresses which correspond to P specific column sets of one page respectively. Thus, in a reading operation period of one page, the page address signal $S_{PA}$ varies to indicate P addresses. According to the page address signal $S_{PA}$, the control unit 115 generates a control signal S115A to the fast read-page address write multiplexer 111 and the low power sensing amplifier groups $112_1$-$112_P$ and further generates a control signal S115B and a flag signal S115C to the output unit 114, wherein the control signal S115B varies with variation of the page address signal $S_{PA}$.

The fast read-page address write multiplexer 111 and the low power sensing amplifier groups $112_1$-$112_P$ are controlled by the control signal S115A. When the page address signal $S_{PA}$ indicates an initial input address, the data read from the column group of the read page corresponding to the initial input address serves as initial address data, and, according to the control signal S115A, the fast read-page address write multiplexer 111 is coupled to the read-write multiplexer coupled to the specific column set where the initial address data is read. Note that, it is not necessary that the recited initial input address indicates the specific column set which is arrange as the first one among the P specific column sets. However, the initial input address is used to indicate the specific column set to which a reading operation of one page is performed first, and the specific column set indicated by the initial input address may be the specific column set which is arranged as the second or third one among the P specific column sets. In the embodiment, it is assumed that the initial input address indicates the specific column set which is arranged as the second one among the P specific column sets (referred to the second specific column). When the page address signal $S_{PA}$ indicates the initial input address, the data which is read from the second specific column set serves as the initial address data, and the fast read-page address write multiplexer 111 is coupled to the read-write multiplexer $110_2$ according to the control signal S115A. Then, the fast read-page address write multiplexer 111 transmits the initial address data to the high speed sensing amplifiers $SAH_1$-$SAH_N$ in the high speed sensing amplifier set 113, and the high speed sensing amplifier set 113 generates a sensing output signal OSAH according to the initial address data to the output unit 114. The output unit 114 selects the sensing output signal OSAH and outputs the sensing output signal OSAH to the output buffer 117 according to the control signal S115B and the flag signal S115C. At this time, the low power sensing amplifier set $112_2$ coupled to the read-write multiplexer $110_2$ is inactive and does not generate a sensing output signal. The other low power sensing amplifier sets $112_1$ and $112_3$-$112_P$ generate sensing output signals $OSAL_1$ and $OSAL_3$-$OSAL_P$ according to the data received from the read-write multiplexers $110_1$ and $110_3$-$110_P$ respectively. The output unit 114 receives and temporarily stores the sensing output signals $OSAL_1$ and $OSAL_3$-$OSAL_P$ and the sensing output signal OSAH.

As described above, the output unit 114 is controlled by the control signal S115B and the flag signal S115C generated by the control unit 115. When the page address signal $S_{PA}$ indicates the initial input address, the control unit 115 asserts the flag signal S115C. At this time, the output unit 114 selects the sensing output signal OSAH and outputs the sensing output signal OSAH to the output buffer 117 according to the asserted flag signal S115C. The output buffer 117 then outputs the sensing output signal OSAH to serve as output data OUT. When the page address signal $S_{PA}$ does not indicate the initial input address, the control unit 115 de-asserts the flag signal S115C. At this time, the output unit 114 outputs one of the sensing output signals $OSAL_1$ and $OSAL_3$-$OSAL_P$ each time according to the variation of the control signal S115B, for example, the output unit 114 outputs the sensing output signals $OSAL_1$ and $OSAL_3$-$OSAL_P$ successively. The output buffer 114 then outputs the sensing output signals $OSAL_1$ and $OSAL_3$-$OSAL_P$ to serve as the output data OUT successively.

According to the above embodiment, in a reading operation period of one page, the initial address data of an initial input address are read by the fast read-page address write multiplexer 111 and the high speed sensing amplifier group 113. The following data in the same page is read by the low power sensing amplifier groups. Since the initial address data is read by the high speed sensing amplifier groups 113, the reading rate of one page can be raised. Moreover, the data following the initial address data is sensed and amplified by the low power sensing amplifier groups, so that the power consumption of the memory system 1 can be decreased.

Figure 2:
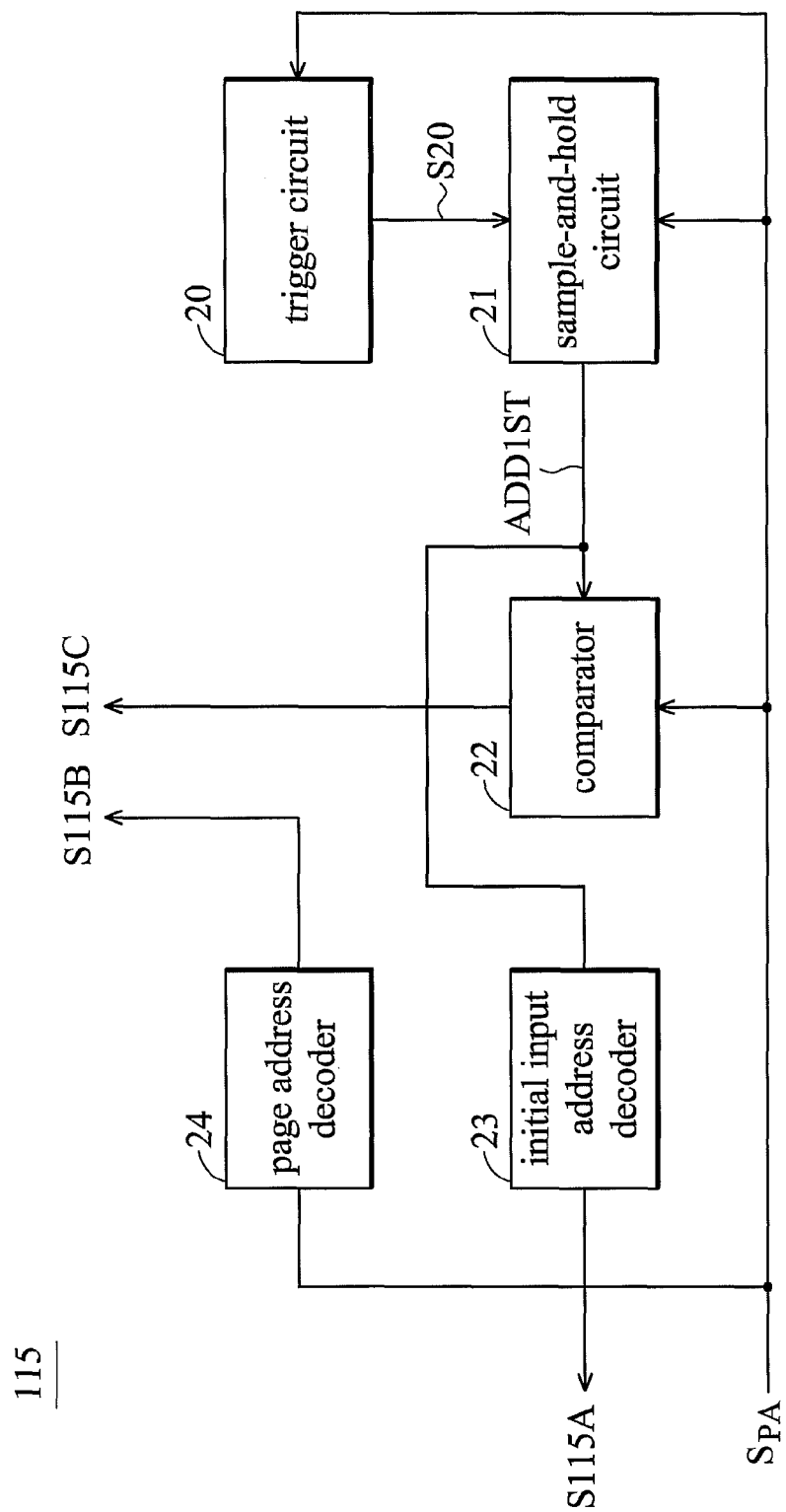
FIG. 2 shows an exemplary embodiment of a control unit in the memory system of FIG. 1.

FIG. 2 shows an exemplary embodiment of the control unit 115. Referring to FIG. 2, the control unit 115 comprises a trigger circuit 20, a sample-and-hold circuit 21, a comparator 22, an initial input address decoder 23, and a page address decoder 24. The sample-and-hold circuit 21, the comparator 22, and the page address decoder 24 receive the page address signal $S_{PA}$. At the beginning of a reading operation period of one page, the trigger circuit 20 generates a trigger signal S20 according to the variation of the page address signal $S_{PA}$ or a read enabling signal and provides the trigger signal S20 to the sample-and-hold circuit 21. At the same time, the current input address currently indicated by the page address signal $S_{PA}$ is an initial input address ADD1ST. The sample-and-hold circuit 21 samples and stores the initial input address ADD1ST according to the trigger signal S20. The comparator 22 receives not only the page address signal $S_{PA}$ but also the initial input address ADD1ST from the sample-and-hold circuit 21 and generates the flag signal S115C. The comparator 22 compares the current input address of the page address signal $S_{PA}$ with the initial input address ADD1ST and asserts or de-asserts the flag signal S115C according to the comparison result. The initial input address decoder 23 also receives the initial input address ADD1ST from the sample-and-hold circuit 21 and decodes the initial input address ADD1ST to generate the control signal S115A to the fast read-page address write multiplexer 111 and the low power sensing amplifier groups 112$_1$-112$_P$. The page address decoder 24 receives the page address signal $S_{PA}$ and decodes the page address signal $S_{PA}$ to generate the control signal S115B to the output unit 114.

The operation of the control unit 115 will be described in the following. According to the above example, it is also assumed that, in a reading operation of one page, the initial input address indicates the specific column set which is arranged as the second one among the P specific column sets (referred to the second specific column), and the second specific column corresponds to the read-write multiplexer 110$_2$. At the beginning of the reading operation period, the page address signal $S_{PA}$ indicates the initial input address ADD1ST. At this time, the trigger circuit 20 generates the trigger signal S20 to the sample-and-hold circuit 21, so that the sample-and-hold circuit 21 samples the page address signal $S_{PA}$ to obtain and store the initial input address ADD1ST according to the trigger signal S20. In the reading operation period, the comparator 22 compares the current input address of the page address signal $S_{PA}$ with the initial input address ADD1ST in the reading operation period. Since the current input address of the page address signal $S_{PA}$ is the initial input address ADD1ST at the beginning of the reading operation period, the comparator 22 determines that the current input address of the page address signal $S_{PA}$ is the same as the initial input address ADD1ST. At this time, the comparator 22 asserts the flag signal S115C. The initial input address decoder 23 generates the control signal S115A according to the initial input address ADD1ST, and the fast read-page address write multiplexer 111 transmits the initial address data to the high speed sensing amplifiers SAH$_1$-SAH$_N$ in the high speed sensing amplifier group 113 according to the control signal S115A. Moreover, the low power sensing amplifier group 112$_2$ accordingly coupled to the read-write multiplexer 110$_2$ is inactive according to the control signal S115A. The other low power sensing amplifier groups 112$_1$ and 112$_3$-112$_P$ receive the data from the read-write multiplexer 110$_1$ and 110$_3$-110$_P$ respectively. At this time, the control signal S115B which is generated by the page address decoder 24 according the page address signal $S_{PA}$ is transmitted to the output unit 114. However, since the flag signal S115C is asserted, the output unit 114 is not affected by the control signal S115B. The output unit 114 selects the sensing output signal OSAH and outputs the sensing output signal OSAH to the output buffer 117 according to the asserted flag signal S115C.

After, with the variation of the page address signal $S_{PA}$, the current input address of the page address signal $S_{PA}$ is not the initial input address ADD1ST. Thus, the comparator 22 determines that the current input address of the page address signal $S_{PA}$ is different from the initial input address ADD1ST. At this time, the comparator 22 de-asserts the flag signal S115C. Since the flag signal S115C is de-asserted, the output unit 114 outputs one of the sensing output signals OSAL$_1$ and OSAL$_3$-OSAL$_P$ to the output buffer 117 according to the control signal S115B which is generated from the page address decoder 24 and derived from the page address signal $S_{PA}$. That is, the output unit 114 outputs one of the sensing output signals OSAL$_1$ and OSAL$_3$-OSAL$_P$ to the output buffer 117 according to the variation of the control signal S115B.

Figure 3A:
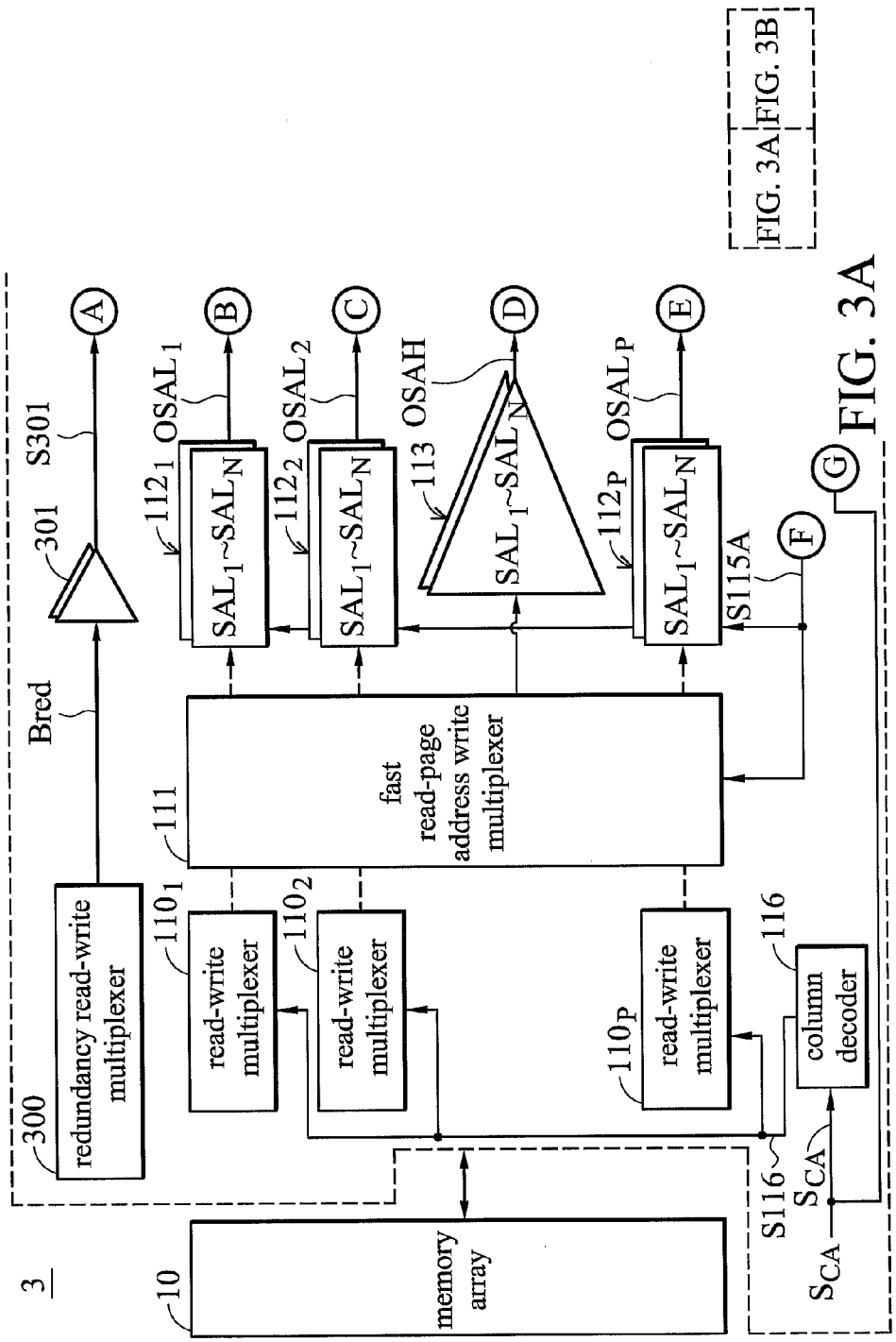
FIGS. 3A and 3B show another exemplary embodiment of a memory system.
Figure 3B:
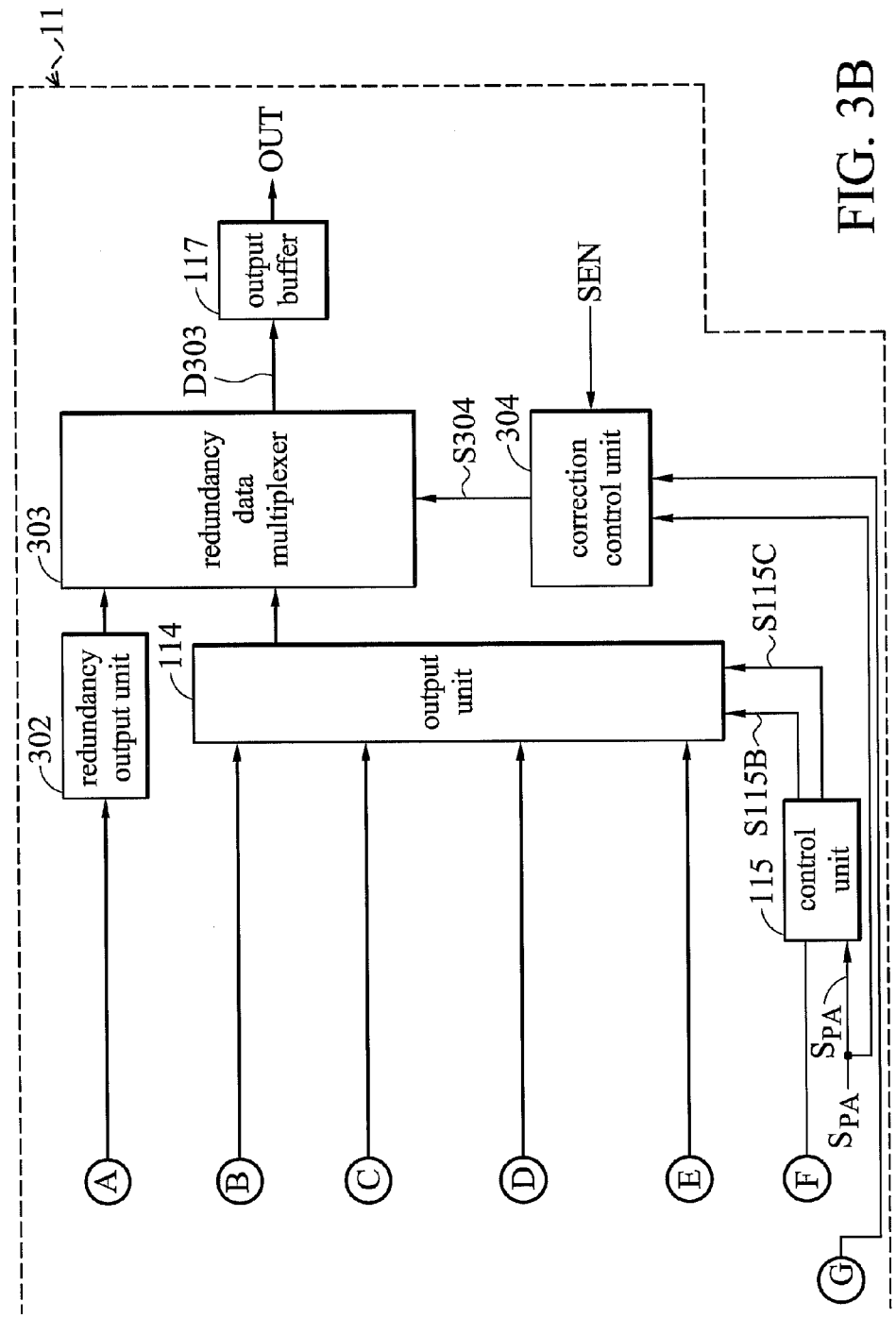

FIG. 3 shows another exemplary embodiment of a memory system. In the memory system 1 of FIG. 1 and a memory system 3 of FIG. 3, the elements labeled by the same reference symbols perform the same operations, and the same operations are omitted here. Compared with the memory system 1 of FIG. 1, the reading device 11 further comprises a redundancy read-write multiplexer 300, a high speed sensing amplifier group 301, a redundancy output unit 302, a redundant data multiplexer 303, and a correction control unit 304. The correction control unit 304 generates a correction control signal S304 according to a correction enable signal SEN, the page address signal $S_{PA}$, and the column address signal $S_{CA}$ to control the redundant data multiplexer 303 to perform a correction operation. In the following, it is also assumed that that the initial input address indicates the specific column set which is arranged as the second one among the P specific column sets.

The high speed sensing amplifier group 301 is coupled between the redundancy read-write multiplexer 300 and the redundancy output unit 302. The redundant data multiplexer 303 is coupled to the output unit 114, and, in the reading operation period, the output unit 114 selectively outputs one of the sensing output signal OSAH and the sensing output signals OSAL$_1$ and OSAL$_3$-OSAL$_P$ to the redundant data multiplexer 303 according to the control signal S115B and the flag signal S115C. The correction control unit 304 determines whether one of the sensing output signal OSAH and the sensing output signals OSAL$_1$ and OSAL$_3$-OSAL$_P$ is required to be corrected in a reading operation period for one page according to the correction enable signal SEN, the page address signal $S_{PA}$, and the column address signal $S_{CA}$. In a reading operation period of one page, the redundancy read-write multiplexer 300 reads a redundant column bit Bred from the redundant memory cell column and transmits the redundant column bit Bred to the high speed sensing amplifier group 301. The high speed sensing amplifier group 301 generates a correction sensing output signal S301 according to the redundant column bit Bred and transmits the correction sensing output signal S301 to the redundant data multiplexer 303 through the redundancy output unit 302. At the same time, the output unit 114 outputs the sensing output signal OSAH from the high speed sensing amplifier group 113 or one of the sensing output signals OSAL$_1$ and OSAL$_3$-OSAL$_P$ from the low power sensing amplifier groups 112$_1$-112$_P$ to the redundant data multiplexer 303 according to the asserted flag signal S115C. The redundant data multiplexer 303 receives one sensing output signal from the output unit 114 and the correction sensing output signal S301 from the redundancy output unit 302. When the correction enable signal SEN is asserted, the correction control unit 304 determines that a correction operation is required and asserts the correction control signal S304. In the period when the correction enable signal SEN is asserted, the redundant data multiplexer 303 replaces one bit of at least one of the sensing output signals from the output unit 114 with one bit of the correction sensing output signal S301 to generate correction data D303. The redundant data multiplexer 303 outputs the correction data D303 to the output buffer 117.

In another embodiment, it is assumed that the redundancy read-write multiplexer 300 reads a plurality of redundant column bits Bred from the redundant memory cell column, for example two redundant column bits Bred in the following embodiment. In the period when the correction enable signal SEN is asserted, the redundancy data multiplexer 303, according to the asserted correction control signal S304, may replace two bits of at least one of the sensing output signals from the output unit 114 with the two bits of the correction sensing output signal S301 or replace one bit of each of two sensing output signals from the output unit 114 respectively with the two bits of the correction sensing output signal S301.

In the memory system 3, when the correction enable signal SEN is de-asserted, the correction control unit 304 determines that a correction operation is not required. At this time, the correction control unit 304 de-asserts the correction control signal S304. According to the de-asserted correction control signal S304, the redundancy data multiplexer 303 directly outputs the sensing output signals received from the output unit 114 to the output buffer 117.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A reading device for a memory array comprising a plurality of memory cell columns, the reading device comprising:

a plurality of first sensing amplifier groups, each selectively generating a first sensing output signal;

a second sensing amplifier group generating a second sensing output signal; and an output unit, coupled to the plurality of first sensing amplifier groups and the second sensing amplifier group, temporarily storing the second sensing output signal and the first sensing output signals, and selectively outputting one of the second sensing output signal and the first sensing output signals according to a page address signal, wherein in a reading operation period, the reading device reads data from a column group among the plurality of memory cell columns to the plurality of first sensing amplifier groups according to a column address signal, and the column group comprises a plurality of specific column sets, and wherein in the reading operation period, when the page address signal indicates an initial input address, data read from the specific column set corresponding to the initial input address serves as initial address data, and the initial address data is transmitted to the second sensing amplifier group, and the second sensing amplifier group generates the second sensing output signal according to the initial address data.

2. The reading device as claimed in claim 1, wherein each of the first sensing amplifier groups comprises a plurality of low power sensing amplifiers, and the second sensing amplifier group comprises a plurality of high speed sensing amplifiers.

3. The reading device as claimed in claim 1 further comprising:

a plurality of read-write multiplexers controlled by the column address signal and respectively coupled to the plurality of first sensing amplifier groups; and a fast read-page address write multiplexer controlled by the page address signal and coupled to the second sensing amplifier group, wherein in the reading operation period, each of the plurality of read-write multiplexers is coupled to one of the plurality of specific column sets according to the column address signal to read data and transmit the data read from the one specific column set to the corresponding first sensing amplifier group, and the corresponding first sensing amplifier group generates the corresponding first sensing output signal according to the data received from the read-write multiplexer, and wherein when the page address signal indicates the initial input address in the reading operation period, the fast read-page address write multiplexer is coupled to the read-write multiplexer coupled to the specific column set where the initial address data is read according to the page address signal to read the initial address data and transmit the initial address data to the second sensing amplifier group.

4. The reading device as claimed in claim 3 further comprising:

a control unit receiving the page address signal, wherein according to the page address signal, the control unit generates a first control signal and a flag signal to the output unit and generates a second control signal to the fast read-page address write multiplexer and the plurality of first sensing amplifier groups, wherein when the page address signal indicates the initial input address in the reading operation period, the fast read-page address write multiplexer is coupled to the read-write multiplexer coupled to the specific column set where the initial address data is read according to the second control signal to transmit the initial address data to the second sensing amplifier group, and wherein when the page address signal indicates the initial input address in the reading operation period, the control unit asserts the flag signal, and the output unit outputs the second sensing output signal according to the asserted flag signal.

5. The reading device as claimed in claim 4, wherein when the page address signal indicates the initial input address in the reading operation period, the first sensing amplifier group coupled to the specific column set where the initial address data is read is inactive and does not generate the corresponding first sensing output signal according to the second control signal.

6. The reading device as claimed in claim 4, wherein when the page address signal does not indicate the initial input address in the reading operation period, the control unit de-asserts the flag signal, and the output unit outputs one of the plurality of first sensing output signals according to variation of the first control signal.

7. The reading device as claimed in claim 4, wherein the control unit comprises:

a sample-and-hold circuit receiving the page address signal and storing the initial input address in the reading operation period;

a comparator receiving the initial input address from the sample-and-hold circuit and the page address signal, generating the flag signal, comparing a current input address currently indicated by the page address signal with the initial input address, and asserting or de-asserting the flag signal according to the comparison result;

an initial input address decoder receiving the initial input address and decoding the initial input address to generate the second control signal to the fast read-page address write multiplexer and the plurality of first sensing amplifier groups; and a page address decoder receiving the page address signal and decoding the page address to generate the first control signal, wherein when the page address signal indicates the initial input address in the reading operation period, the comparator determines that the current address is the same as the initial input address.

8. The reading device as claimed in claim 7, wherein when the comparator determines that the current address is the same as the initial input address in the reading operation period, the first sensing amplifier group coupled to the specific column set where the initial address data is read is inactive and does not generate the corresponding first sensing output signal according to the second control signal.

9. The reading device as claimed in claim 7, wherein when the comparator determines that the current address is different from the initial input address in the reading operation period, the comparator disables the flag signal, and the output unit outputs one of the plurality of first sensing output signals according to variation of the first control signal.

10. The reading device as claimed in claim 7, wherein the control unit further comprises:
    a trigger circuit generating a trigger signal to the sample-and-hold circuit at the beginning of the reading operation period, so that the sample-and-hold circuit samples the current input address currently indicated by the page address signal to serve as the initial input address.

11. The reading device as claimed in claim 1, wherein when the page address signal does not indicate the initial input address in the reading operation period, the fast read-page address write multiplexer does not read data from any read-write multiplexer to the second sensing amplifier group.

12. The reading device as claimed in claim 1 further comprising:
    a control unit receiving the page address signal,
    wherein according to the page address signal, the control unit generates a first control signal and a flag signal to the output unit and generates a second control signal to the plurality of first sensing amplifier groups,
    wherein when the page address signal indicates the initial input address in the reading operation period, the control unit asserts the flag signal, and the output unit outputs the second sensing output signal according to the asserted flag signal, and
    wherein when the page address signal does not indicate the initial input address in the reading operation period, the control unit de-asserts the flag signal, and the output unit outputs one of the plurality of first sensing output signals according to variation of the first control signal.

13. The reading device as claimed in claim 12, wherein when the page address signal indicates the initial input address in the reading operation period, the first sensing amplifier group coupled to the specific column set where the initial address data is read is inactive and does not generate the corresponding first sensing output signal according to the second control signal.

14. The reading device as claimed in claim 1, wherein when the page address signal indicates the initial input address in the reading operation period, the output unit outputs the second sensing output signal according to the page address signal.

15. The reading device as claimed in claim 1, wherein when the page address signal does not indicate the initial input address in the reading operation period, the output unit outputs one of the plurality of first sensing output signals according to variation of the page address signal.

16. The reading device as claimed in claim 1, wherein the memory array further comprises at least one redundant memory cell column, and the reading operation further comprises:
    a redundancy read-write multiplexer coupled to the at least one redundant memory cell column;
    a third sensing amplifier group generating a correction sensing output signal;
    a redundancy output unit coupled to the third sensing amplifier group and temporarily storing the correction sensing output signal; and
    a redundant data multiplexer coupled to the output unit and the redundancy output unit, receiving the correction sensing output signal, and selectively receiving of the second sensing output signal and the first sensing output signals,
    wherein in the reading operation period, when the page address signal indicates the initial input address and a correction enable signal is asserted, the redundancy read-write multiplexer reads at least one redundant column bit from the redundant memory cell column and transmits the at least one redundant column bit to the third sensing amplifier group, the third sensing amplifier group generates a correction sensing output signal according to the at least one redundant column bit and transmits the correction sensing output signal to the redundant data multiplexer through the redundancy output unit, and the redundant data multiplexer replaces at least one bit of at least one of the second sensing output signal and the plurality of first sensing output signals with at least one bit of the correction sensing output signal.

17. The reading device as claimed in claim 1 further comprising:
    a column decoder receiving the column address signal and decoding the column address signal to generate a control signal, wherein the control signal is used to control the reading device to operate in the reading operation period,
    wherein in the reading operation period, a reading operation is performed to memory cells of one page in the memory array.

18. A memory system comprising:
    a memory array comprising a plurality of memory cell columns; and
    a reading device reading data from a column group among the plurality of memory cell columns according to a column address signal,
    wherein the column group comprises a plurality of specific column sets, and
    wherein the reading device comprises:
        a plurality of first sensing amplifier groups, each selectively generating a first sensing output signal;
        a second sensing amplifier group generating a second sensing output signal; and
        an output unit, coupled to the plurality of first sensing amplifier groups and the second sensing amplifier group, temporarily storing the second sensing output signal and the first sensing output signals, and selectively outputting one of the second sensing output signal and the first sensing output signals according to a page address signal,
        wherein in the reading operation period, when the page address signal indicates an initial input address, data read from the specific column set corresponding to the initial input address serves as initial address data, the initial address data is transmitted to the second sensing amplifier group, and the second sensing amplifier group generates the second sensing output signal according to the initial address data.

19. The memory system as claimed in claim 18, wherein each of the first sensing amplifier groups comprises a plurality of low power sensing amplifiers, and the second sensing amplifier group comprises a plurality of high speed sensing amplifiers.

20. The memory system as claimed in claim 18 further comprising:
a plurality of read-write multiplexers controlled by the column address signal and respectively coupled to the plurality of first sensing amplifier groups; and
a fast read-page address write multiplexer controlled by the page address signal and coupled to the second sensing amplifier group,
wherein in the reading operation period, each of the plurality of read-write multiplexers is coupled to one of the plurality of specific column sets according to the column address signal to read data and transmit the data read from the one specific column set to the corresponding first sensing amplifier group, and the corresponding first sensing amplifier group generates the corresponding first sensing output signal according to the data received from the read-write multiplexer, and
wherein when the page address signal indicates the initial input address in the reading operation period, the fast read-page address write multiplexer is coupled to the read-write multiplexer coupled to the specific column set where the initial address data is read according to the page address signal to read the initial address data and transmit the initial address data to the second sensing amplifier group.

21. The memory system as claimed in claim 20, wherein when the page address signal does not indicate the initial input address in the reading operation period, the fast read-page address write multiplexer does not read data from any read-write multiplexer to the second sensing amplifier group.

22. The memory system as claimed in claim 20 further comprising:

a control unit receiving the page address signal,
wherein according to the page address signal, the control unit generates a first control signal and a flag signal to the output unit and generates a second control signal to the fast read-page address write multiplexer and the plurality of first sensing amplifier groups,
wherein when the page address signal indicates the initial input address in the reading operation period, the fast read-page address write multiplexer is coupled to the read-write multiplexer coupled to the specific column set where the initial address data is read according to the second control signal to transmit the initial address data to the second sensing amplifier group, and
wherein when the page address signal indicates the initial input address in the reading operation period, the control unit asserts the flag signal, and the output unit outputs the second sensing output signal according to the asserted flag signal.

23. The memory system as claimed in claim 22, wherein when the page address signal indicates the initial input address in the reading operation period, the first sensing amplifier group coupled to the specific column set where the initial address data is read is inactive and does not generate the corresponding first sensing output signal according to the second control signal.

24. The memory system as claimed in claim 22, wherein when the page address signal does not indicate the initial input address in the reading operation period, the control unit de-asserts the flag signal, and the output unit outputs one of the plurality of first sensing output signals according to variation of the first control signal.

25. The memory system as claimed in claim 18, wherein when the page address signal indicates the initial input address in the reading operation period, the output unit outputs the second sensing output signal according to the page address signal.

26. The memory system as claimed in claim 18, wherein when the page address signal does not indicate the initial input address in the reading operation period, the output unit outputs one of the plurality of first sensing output signals according to variation of the page address signal.

* * * * *